(12) United States Patent
Honjo et al.

(10) Patent No.: US 7,473,854 B2
(45) Date of Patent: Jan. 6, 2009

(54) PRINTED CIRCUIT BOARD

(75) Inventors: Mitsuru Honjo, Osaka (JP); Yuki Saitou, Osaka (JP); Yoshifumi Morita, Osaka (JP); Yoshifumi Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/380,008

(22) Filed: Apr. 25, 2006

(65) Prior Publication Data
US 2006/0246268 A1    Nov. 2, 2006

(30) Foreign Application Priority Data
Apr. 28, 2005    (JP) .............................. 2005-131308

(51) Int. Cl.
*B32B 9/00*    (2006.01)
*H05K 1/02*    (2006.01)
*H01R 9/00*    (2006.01)

(52) U.S. Cl. ...................... 174/261; 361/772; 361/774; 428/209

(58) Field of Classification Search ................. 428/209; 174/255, 261; 361/772, 774
See application file for complete search history.

(56) References Cited
U.S. PATENT DOCUMENTS
4,855,537 A    8/1989  Nakai et al.
6,184,478 B1    2/2001  Imano et al.
2002/0040807 A1    4/2002  Doberenz

FOREIGN PATENT DOCUMENTS

| JP | 05-152768 A | 6/1993 |
|---|---|---|
| JP | 05-343820 A | 12/1993 |
| JP | 06-326476 A | 11/1994 |
| JP | 07-202359 A | 8/1995 |
| JP | 07-302979 A | 11/1995 |
| JP | 09-275251 A | 10/1997 |
| JP | 11-298149 A | 10/1999 |
| JP | 2000-077802 A | 3/2000 |
| JP | 2000-114722 A | 4/2000 |
| JP | 2003-133659 A | 5/2003 |

*Primary Examiner*—Cathy Lam
(74) *Attorney, Agent, or Firm*—Panitch Schwarze Belisario & Nadel LLP

(57) ABSTRACT

A ground pattern includes a plurality of integrally formed first to third ground lines. A plurality of first ground lines are arranged parallel to one another at equal intervals. A plurality of second ground lines are arranged parallel to one another at equal intervals between adjacent ones of the first ground lines. A plurality of third ground lines are arranged parallel to one another at equal intervals between adjacent ones of the first ground lines at a predetermined angle with respect to the second ground lines. The third ground lines each connect one end of one adjacent second ground line with the other end of another adjacent second ground line. The ground lines form triangular openings.

12 Claims, 2 Drawing Sheets

PRINTED CIRCUIT BOARD

BACKGROUND OF THE INVENTION

1. Field of the Invention

The present invention relates to a printed circuit board.

2. Description of the Background Art

A flexible printed circuit board has for example an wiring layer of conductor formed on one surface of an insulating layer and a ground pattern formed on the other surface. Various circuit elements are mounted on the flexible printed circuit board. When the wiring layer transmits a high frequency signal, the input/output impedance of the circuit elements and the characteristic impedance of the wiring layer must be matched.

The characteristic impedance Z of the wiring layer is represented by the following expression:

$$Z = \sqrt{\frac{L}{C}} \quad (1)$$

where C represents the capacitance between the wiring layer and the ground pattern, and L represents the inductance of the wiring layer.

From Expression 1, the capacitance C between the wiring layer and the ground pattern is adjusted, so that the characteristic impedance of the wiring layer can be adjusted.

The capacitance is determined based on the area of the region in which the wiring layers and the ground pattern oppose each other, and therefore the capacitance can be adjusted by adjusting the width of the wiring layer. In this way, the characteristic impedance can be adjusted.

When the input/output impedance of the circuit elements is high, the width of the wiring layer must be reduced in order to raise the characteristic impedance. However, there is a limit to how much the width of the wiring layer can be reduced. The limit makes it difficult to raise the characteristic impedance. The capacitance may be reduced by increasing the thickness of the insulating layer. When the insulating layer has a large thickness, however, the flexibility of the flexible printed circuit board is deteriorated.

A technique of forming regular openings in the ground pattern and reducing the area of the ground pattern has been proposed (see JP 2000-77802 A and JP 5-343820 A).

When the area of the ground pattern region opposing the wiring layer is reduced, the capacitance decreases, and the characteristic impedance can be increased.

FIG. 3 is a plan view of an example of a conventional flexible printed circuit board disclosed by JP 5-343820 A, and FIG. 4 is a sectional view of the flexible printed circuit board in FIG. 3.

As shown in FIGS. 3 and 4, a plurality of wiring layers 12 are formed on one surface of an insulating layer 11, and a ground pattern 13 is formed on the other surface.

The ground pattern 13 includes a plurality of ground lines 201 and 202 orthogonal to one another. In this manner, a plurality of square openings 13a are regularly formed. The wiring layers 12 are at an angle of 45° with respect to the ground lines 201 and 202. As shown in FIG. 4, cover insulating layers 15 are formed to cover the wiring layers 12 and the ground pattern 13 on the surfaces of the base insulating layer 11 with adhesive layers 14 therebetween.

In this way, the area of the region of the ground pattern 13 opposing the wiring layers 12 can be reduced, and the characteristic impedance of the wiring layers 12 can be increased.

In the conventional flexible printed circuit board described above, when the relative position between the wiring layers 12 and the ground pattern 13 is shifted, the area of the region in which the wiring layers 12 and the ground pattern 13 oppose to one another changes. This causes the characteristic impedance of the wiring layers 12 to vary.

Therefore, there is a restriction on the position of the wiring layers 12 in design. The wiring layers 12 and the ground pattern 13 must be registered with one another with high accuracy in the manufacture.

SUMMARY OF THE INVENTION

It is an object of the present invention to provide a printed circuit board that allows the positional restriction on the wiring layers in design and the registration accuracy requirement for the wiring layers in the manufacture to be eased.

(1)

A printed circuit board according to one aspect of the invention includes an insulating layer, a wiring layer formed on one surface of the insulating layer, and a conductor pattern formed on the other surface of the insulating layer, and the conductor pattern has a plurality of regularly formed triangular openings.

In the printed circuit board, the plurality of openings are formed in the conductor pattern, and therefore the area of the region in which the wiring layers and the conductor pattern oppose each other is reduced. The capacitance between each of the wiring layers and the conductor pattern is reduced, which increases the characteristic impedance of the wiring layers. Consequently, even when the input/output impedance of the circuit elements is high, the input/output impedance of the circuit elements and the characteristic impedance of the wiring layers can be matched. In this way, the characteristic impedance of the wiring layers can arbitrarily be adjusted by adjusting the area of the plurality of openings.

Furthermore, since the openings are in a triangular shape, if there is a positional shift of the wiring layers relative to the conductor pattern, variation in the area of the region in which the wiring layers and the conductor pattern oppose each other is reduced. In this way, the positional restriction on the wiring layers in design and the registration accuracy requirement for the wiring layers in the manufacture can be eased.

(2)

The plurality of openings may each have a regular triangle shape. In this way, there are three options for positional relation between each opening and each wiring layer so that equal capacitance is obtained. Thus, the flexibility in positioning the wiring layers in design can be increased.

(3)

The plurality of openings may each have three sides that are not orthogonal to the direction of the wiring layers. In this way, if there is a positional shift of the wiring layers relative to the conductor pattern, variation in the area of the region in which the wiring layers and the conductor pattern oppose each other is more reduced. In this way, the positional restriction on the wiring layers in design and the registration accuracy requirement for the wiring layers in the manufacture can be more eased.

(4)

The plurality of openings may each have one side at an angle of 60° with respect to the direction of the wiring layers. In this way, if there is a positional shift of the wiring layers relative to the conductor pattern, variation in the area of the region in which the wiring layers and the conductor pattern oppose each other is even more reduced. In this way, the positional restriction on the wiring layers in design and the registration accuracy requirement for the wiring layers in the manufacture can be even more eased.

(5)

The conductor pattern may include a plurality of first linear segments parallel to one another, a plurality of second linear segments arranged between adjacent ones of the first linear segments at a first angle with respect to the first linear segments and parallel to one another, and a plurality of third linear segments arranged between adjacent ones of the first linear segments at a second angle with respect to the first linear segments and parallel to one another, the plurality of second and third linear segments may be arranged to form a plurality of first triangles and a plurality of second triangles between adjacent ones of the first linear segments, and the first and second triangles may be 180° rotated from one another in shape on the insulating layer.

In this way, if there is a positional shift of the wiring layers relative to the conductor pattern, variation in the area of the region in which the wiring layers and the conductor pattern oppose each other is sufficiently reduced. Consequently, the positional restriction on the wiring layers in design and the registration accuracy requirement for the wiring layers in the manufacture can sufficiently be eased.

(6)

The plurality of first linear segments may be arranged parallel to one another at equal intervals. In this way, if there is a positional shift of the wiring layers relative to the conductor pattern, variation in the area of the region in which the wiring layers and the conductor pattern oppose each other is more reduced. Consequently, the positional restriction on the wiring layers in design and the registration accuracy requirement for the wiring layers in the manufacture can be more eased.

(7)

The plurality of second and third linear segments may have the same length. In this way, each of the openings has an isosceles triangle shape or a regular triangle shape. In this way, there are at least two positional relations that can be selected between each opening and each wiring layer so that equal capacitance is obtained. Consequently, the flexibility in positioning the wiring layers in design can be increased.

(8)

The first and second angles may be 60°. In this way, each of the openings has a regular triangle shape. Consequently, there can be three positional relations that can be selected between each of the openings and each of the wiring layers so that equal capacitance is obtained. Therefore, the flexibility in positioning the wiring layer in design can be increased.

(9)

The first and second triangles may be arranged in directions orthogonal to the plurality of first linear segments. In this way, if there is a positional shift of the wiring layers relative to the conductor pattern, variation in the area of the region in which the wiring layers and the conductor pattern oppose each other is more reduced. Consequently, the positional restriction on the wiring layers in design and the registration accuracy requirement for the wiring layers in the manufacture can be more eased.

(10)

The plurality of first linear segments may be arranged at a third angle other than 90° with respect to the wiring layers. In this way, if there is a positional shift of the wiring layers relative to the conductor pattern, variation in the area of the region in which the wiring layers and the conductor pattern oppose each other is more reduced. Consequently, the positional restriction on the wiring layers in design and the registration accuracy requirement for the wiring layers in the manufacture can be even more eased.

(11)

The third angle may be 60°. In this way, if there is a positional shift of the wiring layers relative to the conductor pattern, variation in the area of the region in which the wiring layers and the conductor pattern oppose each other is sufficiently reduced. Consequently, the positional restriction on the wiring layers in design and the registration accuracy requirement for the wiring layers in the manufacture can sufficiently be eased.

According to the invention, if there is a positional shift of the wiring layers relative the conductor pattern, variation in the area of the region in which the wiring layers and the conductive pattern oppose each other is reduced. In this way, the positional restriction on the wiring layers in design and the registration accuracy requirement for the wiring layers in the manufacture can be eased.

Other features, elements, characteristics, and advantages of the present invention will become more apparent from the following description of preferred embodiments of the present invention with reference to the attached drawings.

DESCRIPTION OF THE PREFERRED EMBODIMENTS (1) Embodiments

Now, a flexible printed circuit board according to one embodiment of the invention will be described with reference to the accompanying drawings.

Figure 1:
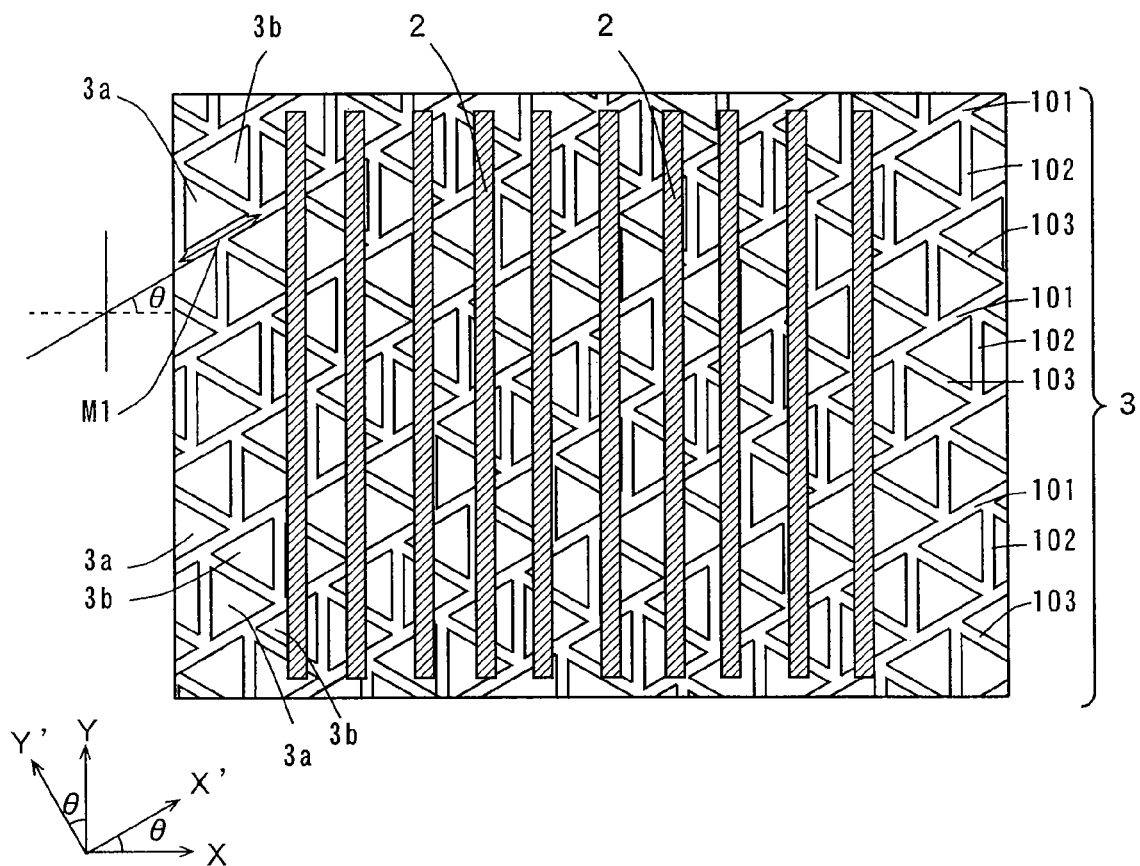
FIG. 1 is a plan view of a flexible printed circuit board according to one embodiment of the invention.
Figure 2:
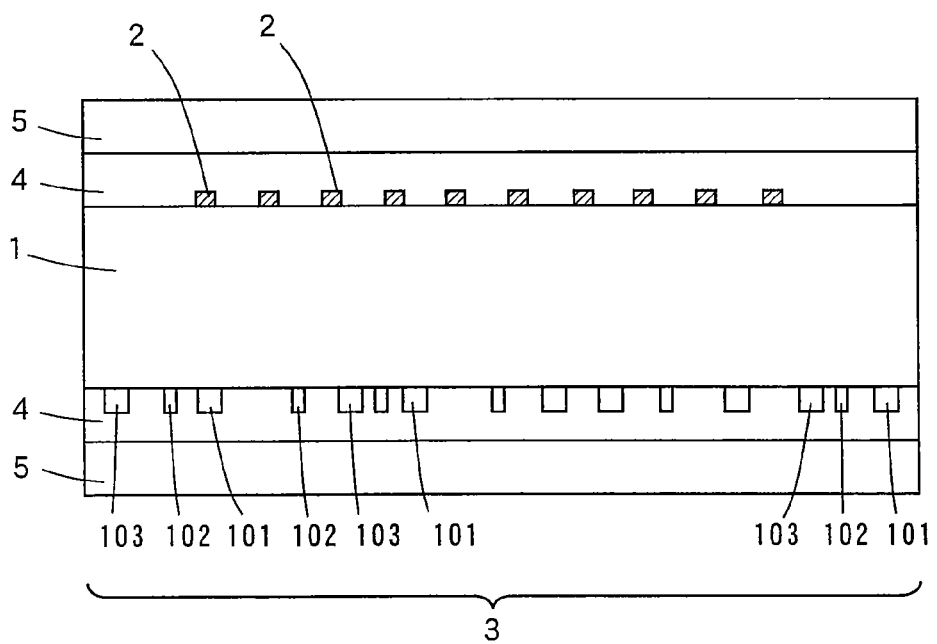
FIG. 2 is a sectional view of the flexible printed circuit board in FIG. 1.

FIG. 1 is a plan view of a flexible printed circuit board according to the embodiment of the invention, and FIG. 2 is a sectional view of the flexible printed circuit board in FIG. 1. Hereinafter, the flexible printed circuit board will be referred to as "printed circuit board."

In FIG. 1, the two directions parallel to the surface of a base insulating layer 1 composed for example of polyimide and orthogonal to each other are defined as "X-direction" and "Y-direction."

As shown in FIGS. 1 and 2, a plurality of wiring layers 2 of conductor such as copper extending in the Y-direction are formed on one surface of the base insulating layer 1. A ground pattern 3 of conductor such as copper is formed on the other surface of the base insulating layer 1.

Herein, in FIG. 1, the two directions parallel to the surface of the base insulating layer 1 and at a predetermined angle θ with respect to the X-direction and the Y-direction are defined as "X'-direction" and "Y'-direction." As shown in FIG. 1, the ground pattern 3 includes a plurality of integrally formed ground lines 101, 102, and 103. The plurality of ground lines 101 are arranged parallel to one another at equal intervals.

The plurality of ground lines 102 are arranged parallel to one another at equal intervals between adjacent ground lines 101. The plurality of ground lines 103 are arranged parallel to one another at equal intervals between the adjacent ground lines 101 and at a predetermined angle with respect to the ground lines 102. The ground lines 103 are each formed to connect one end side of one ground line 102 with the other end side of another adjacent ground line 102.

According to the embodiment, the ground lines 102 and 103 are arranged at 60° with respect to the ground lines 101. In this way, the ground lines 101, 102, and 103 form openings 3a and 3b in the shape of a regular triangle. The openings 3a and 3b have shapes 180° rotated from each other in the X-Y plane. The plurality of openings 3a are arranged both in the X'-direction and the Y'-direction. The plurality of openings 3b are arranged both in the X'-direction and the Y'-direction.

As shown in FIG. 2, a cover insulating layer 5 of for example polyimide is formed to cover the wiring layers 2 and the ground pattern 3 on both surfaces of the base insulating layer 1 with adhesive layers 4 therebetween.

In this way, the printed circuit board including the base insulating layer 1, the wiring layers 2, the ground pattern 3, the adhesive layers 4, and the cover insulating layers 5 is formed.

The base insulating layer 1 preferably has a thickness from 5 μm to 80 μm, more preferably from 10 μm to 50 μm.

The wiring layer 2 preferably has a width from 10 μm to 2000 μm, more preferably from 50 μm to 1000 μm. The interval between adjacent wiring layers 2 is preferably from 20 μm to 1000 μm, more preferably from 50 μm to 500 μm. The wiring layer 2 preferably has a thickness from 5 μm to 50 μm, more preferably from 8 μm to 40 μm.

The ground lines 101, 102, and 103 each preferably has a width from 10 μm to 2000 μm, more preferably from 50 μm to 1000 μm.

The ground pattern 3 preferably has a thickness from 5 μm to 50 μm, more preferably from 8 μm to 40 μm. The opening ratio in the ground pattern 3 is preferably from 50% to 70%, more preferably from 55% to 65%. The mesh size M1 of the ground pattern 3 is preferably from 0.2 mm to 0.8 mm, more preferably from 0.4 mm to 0.6 mm.

The mesh size M1 refers to the length of one side of the regular triangle formed by the central lines of the ground lines 101, 102, and 103 (see FIG. 1).

The angle θ between the X-direction and the X'-direction (ground lines 101) is preferably from 20° to 40°, more preferably from 25° to 35°, even more preferably from 28° to 32°.

A method of manufacturing a printed circuit board may be either subtractive process or semi-additive process. Alternatively, subtractive process and semi-additive process may be combined.

In the printed circuit board according to the embodiment, the ground pattern 3 has the openings 3a and 3b, and therefore the area of the region in which the wiring layers 2 and the ground pattern 3 oppose each other is reduced, which reduces the capacitance. In this way, the characteristic impedance of the wiring layers 2 increases. As a result, when the input/output impedance of the circuit elements is high, the input/output impedance of the circuit elements and the characteristic impedance of the wiring layers 2 can be matched. In this way, the characteristic impedance of the wiring layers 2 can arbitrarily be adjusted by adjusting the area of the openings 3a and 3b.

The openings 3a and 3b in the ground pattern 3 have a triangular shape, and therefore if the position of the wiring layers 2 is shifted in the X-direction (the direction orthogonal to the wiring layers 2), variation in the area of the region in which the wiring layers 2 and the ground pattern 3 oppose each other is reduced.

The plurality of ground lines 101 are in inclined arrangement at the predetermined angle θ with respect to the X-direction (the direction orthogonal to the wiring layers 2), and therefore if the position of the wiring layers 2 is shifted in the X-direction, variation in the area of the region in which the wiring layers 2 and the ground pattern 3 oppose each other is more reduced. Consequently, the positional restriction on the wiring layers 2 in design and the registration accuracy requirement for the wiring layers 2 in the manufacture can be eased.

(2) Correspondence between the elements recited in the claims and the elements according to the embodiments.

In the embodiments described above, the base insulating layer 1 corresponds to the insulating layer, the ground pattern 3 corresponds to the conductor pattern, the ground line 101 corresponds to the first linear section, one of the ground lines 102 and 103 corresponds to the second linear section, and the other of the ground lines 103 and 102 corresponds to the third linear section.

One of the openings 3a and 3b corresponds to the first triangle, and the other of the openings 3b and 3a corresponds to the second triangle.

(3) Other Embodiment

The openings 3a and 3b are preferably in the shape of a regular triangle, but the shape may be an isosceles triangle or other triangular shapes.

The cover insulating layers 5 do not have to be formed on the surfaces of the wiring layer 2 and the ground pattern 3.

Another insulating layer may be formed on the wiring layers 2 with an adhesive layer therebetween instead of the cover insulating layer 5, and another ground pattern similar to the ground pattern 3 may be formed on the insulating layer thus provided. In the case, a cover insulating layer may be formed on the other ground pattern with an adhesive layer therebetween.

The materials for the base insulating layer 1 and the cover insulating layer 5 may include not only polyimide but also other insulating materials such as a polyethylene terephthalate film, a polyethernitrile film, and a polyethersulfone film.

The materials for the wiring layer 2 and the ground pattern 3 may include not only copper but also other metal materials such as a copper alloy, gold, and aluminum.

The material for the adhesive layer 4 may include an epoxy-based adhesive, and a polyimide-based adhesive.

According to the embodiment described above, the invention is applied to a flexible printed circuit board, while the invention may be applied to other kinds of printed circuit boards such as a rigid printed circuit board.

INVENTIVE EXAMPLE

In an inventive example, using a flexible printed circuit board according to the embodiment as shown in FIGS. 1 and 2, variation in the characteristic impedance of the wiring layer caused by a positional shift of the wiring layer was examined.

Ten wiring layers 2 extending in the Y-direction were formed on one surface of the base insulating layer 1. The wiring layer 2 had a thickness of 12 μm and a width of 100 μm. The interval between adjacent wiring layers 2 was 100 μm.

The ground pattern 3 had a thickness of 12 μm, and the angle θ formed between the X'-direction and the X-direction and the angle θ formed between the Y'-direction and Y-direction were both 30°. The mesh size M1 was 0.5 mm, and the opening ratio in the ground pattern 3 was 60%.

COMPARATIVE EXAMPLE

Figure 3:
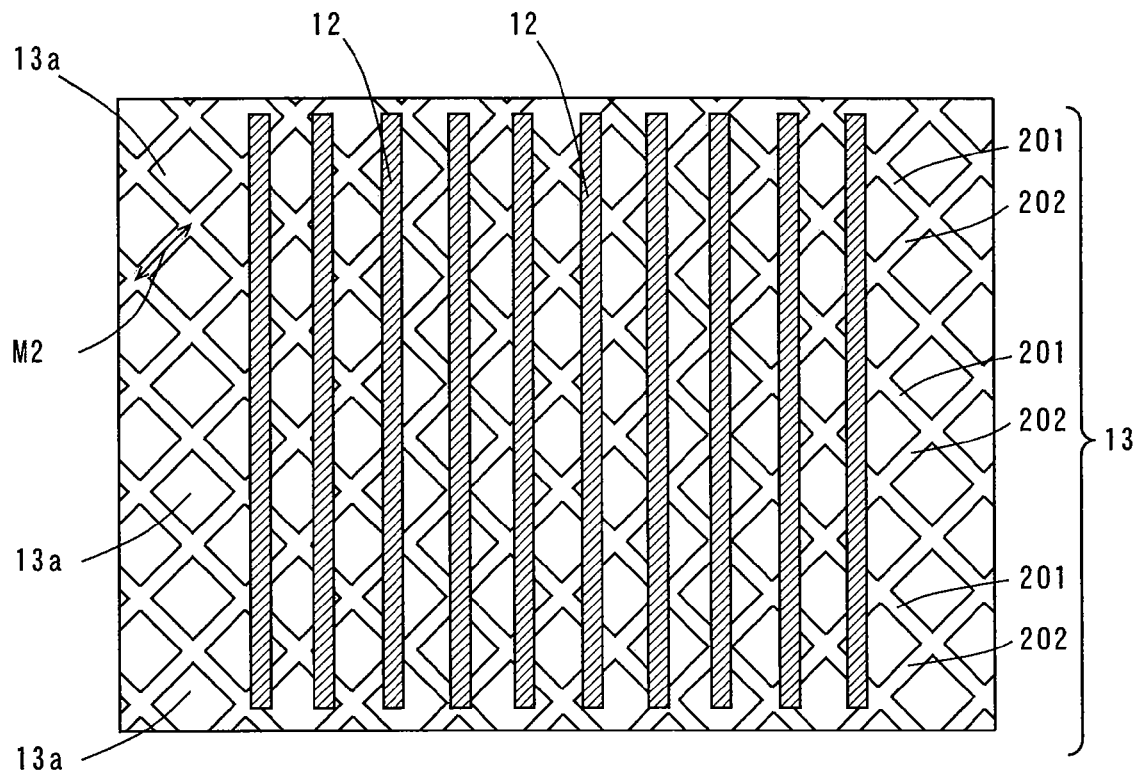
FIG. 3 is a plan view of a conventional flexible printed circuit board.
Figure 4:
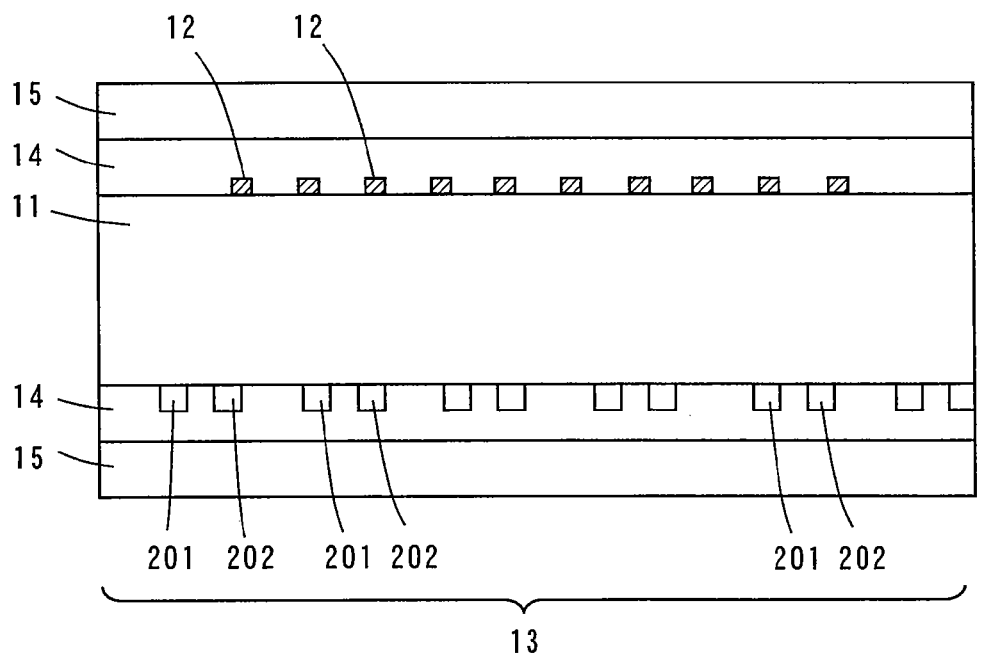
FIG. 4 is a sectional view of the flexible printed circuit board in FIG. 3.

In a comparative example, using a conventional flexible printed circuit board as shown in FIGS. 3 and 4, variation in the characteristic impedance of the wiring layer caused by a positional shift of the wiring layer was examined.

Ten wiring layers 12 that linearly extend were formed on one surface of a base insulating layer 11. The wiring layer 12 had a thickness of 12 μm and a width of 100 μm. The interval between adjacent wiring layers 12 was 100 μm.

The ground pattern 13 has a thickness of 12 μm. The mesh size M2 (the length of one side of the square formed by the central line of each of the ground lines 201 and 202) was 0.5 mm. The opening ratio in the ground pattern 13 was 60%.

Evaluation

All the wiring layers in the printed circuit boards according to the inventive example and the comparative example were measured for their characteristic impedance using a digital oscilloscope according to time domain reflectometry.

In the inventive example, the difference between the maximum value and the minimum value of the characteristic impedance of the wiring layer 2 was not more than 10 Ω.

In the comparative example, the difference between the maximum value and the minimum value of characteristic impedance of the wiring layer 12 was not less than 20 Ω.

As can be understood from the foregoing, when the shape of openings in the ground pattern 3 is a triangle, and the predetermined angle θ is 30° (and the angle formed between the wiring layer 2 and the ground line 101 is 60°), variation in the characteristic impedance of the wiring layer 2 caused by the relative positional shift between the wiring layer 2 and the ground pattern 3 is reduced. In this way, the positional restriction on the wiring layers 2 in design and the registration accuracy requirement for the wiring layer 2 in the manufacture can be eased.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board, comprising:
   an insulating layer;
   a wiring layer formed on one surface of said insulating layer; and
   a conductor pattern formed on the other surface of said insulating layer, the conductor pattern including:
      a plurality of parallel first linear segments overlapping the wiring layer, wherein a pair of adjacent parallel first linear segments defines a row;
      a plurality of second linear segments in between adjacent first linear segments at a first angle with respect to the first linear segments and parallel to one another; and
      a plurality of third linear segments in between adjacent first linear segments at a second angle with respect to the first linear segments and parallel to one another, wherein the plurality of second and third linear segments in between adjacent first linear segments forms a plurality of triangular openings, and wherein said plurality of triangular openings each have at least one of the first, second, and third linear segments at an angle of 60° with respect to the wiring layer.

2. The printed circuit board according to claim 1, wherein said plurality of triangular openings each have three sides that are not orthogonal to the direction of said wiring layer.

3. The printed circuit board according to claim 1, wherein said plurality of first linear segments are arranged parallel to one another at equal intervals.

4. The printed circuit board according to claim 1, wherein said plurality of second and third linear segments have the same length.

5. The printed circuit board according to claim 1, wherein said triangular openings are equilateral triangles.

6. The printed circuit board according to claim 1, wherein said plurality of triangular openings are arranged in directions orthogonal to said plurality of first linear segments.

7. The printed circuit board according to claim 1, wherein said plurality of first linear segments are arranged at a third angle other than 90° with respect to said wiring layer.

8. The printed circuit board according to claim 7, wherein said third angle is 60°.

9. The printed circuit board of claim 1, wherein adjacent triangular openings in the plurality of triangular openings in a row are rotated 180 degrees from one another.

10. The printed circuit board of claim 1, wherein the second linear segments in between adjacent first linear segments is offset from the second linear segments of an adjacent row and the third linear segments in between adjacent first linear segments is offset from the third linear segments of an adjacent row.

11. The printed circuit board of claim 1, wherein at least one of the second and third linear segments in between adjacent first linear segments is offset from the at least one of the second and third linear segments of an adjacent row.

12. A printed circuit board, comprising:
   an insulating layer;
   a wiring layer formed on one surface of said insulating layer; and
   a conductor pattern formed on the other surface of said insulating layer, the conductor pattern including:
      a plurality of parallel first linear segments overlapping the wiring layer, wherein a pair of adjacent parallel first linear segments defines a row;
      a plurality of second linear segments in between adjacent first linear segments at a first angle with respect to the first linear segments and parallel to one another; and
      a plurality of third linear segments in between adjacent first linear segments at a second angle with respect to the first linear segments and parallel to one another, and wherein the plurality of second and third linear segments in between adjacent first linear segments forms a plurality of equilateral or isosceles triangular openings, wherein said plurality of first linear segments are arranged at a third angle other than 90° with respect to said wiring layer.

* * * * *